United States Patent [19]
Sugibayashi et al.

[11] Patent Number: 5,596,542
[45] Date of Patent: Jan. 21, 1997

[54] SEMICONDUCTOR MEMORY DEVICE HAVING DUAL WORD LINE CONFIGURATION

[75] Inventors: Tadahiko Sugibayashi; Satoshi Utsugi; Isao Naritake, all of Tokyo, Japan

[73] Assignee: NEC Corporation, Tokyo, Japan

[21] Appl. No.: 536,189

[22] Filed: Sep. 29, 1995

[30] Foreign Application Priority Data

Sep. 30, 1994 [JP] Japan .................................. 6-259590

[51] Int. Cl.$^6$ ................................................. G11C 8/00
[52] U.S. Cl. .................... 365/230.06; 365/149; 365/200; 365/225.7
[58] Field of Search ................................ 365/230.06, 96, 365/149, 200, 104, 225.7, 63

[56] References Cited

U.S. PATENT DOCUMENTS 5,467,316  11/1995  Kim et al. ........................... 365/230.06

FOREIGN PATENT DOCUMENTS 3-225851  10/1991  Japan .

OTHER PUBLICATIONS

Tadahiko Sugibayashi et al., "A 30ns 256Mb DRAM with Multi-Divided Array Structure", Digest of IEEE International Solid-State Circuits Conference, pp. 50–51, 1993/ session 3.

*Primary Examiner*—Amir Zarabian
*Assistant Examiner*—F. Niranjan
*Attorney, Agent, or Firm*—Whitham, Curtis, Whitham & McGinn

[57] ABSTRACT

In a semiconductor memory device including: a plurality of sub word lines, a plurality of sub word decoders each connected to one of the sub word lines, a plurality of pairs of main word lines each pair connected to a number of the sub word decoders, and a plurality of main word decoders each connected to one of the pairs of main word lines, each of the main word decoders sets voltages at a respective pair of the pairs of main word lines different from each other in a selection mode and sets the voltages at a respective pair of the pairs of main word lines the same as each other in a non-selection mode.

10 Claims, 18 Drawing Sheets

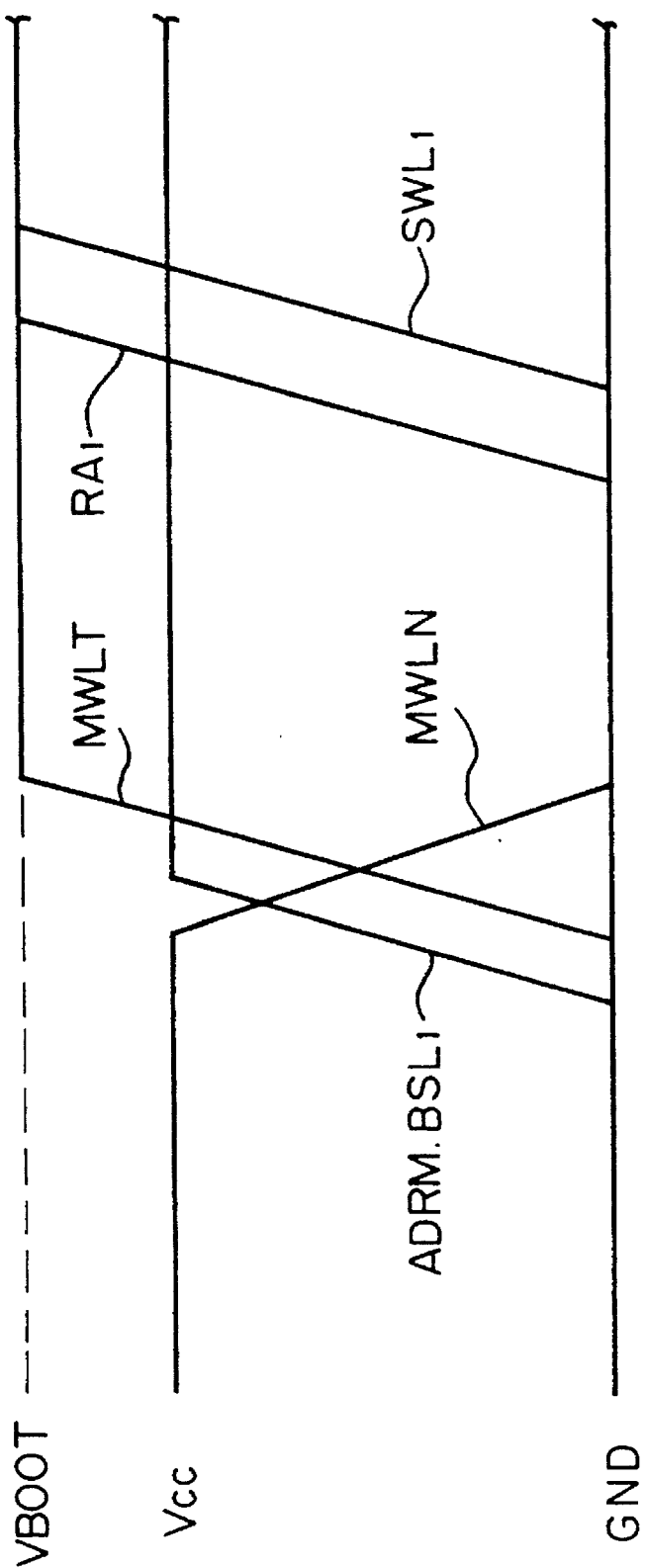

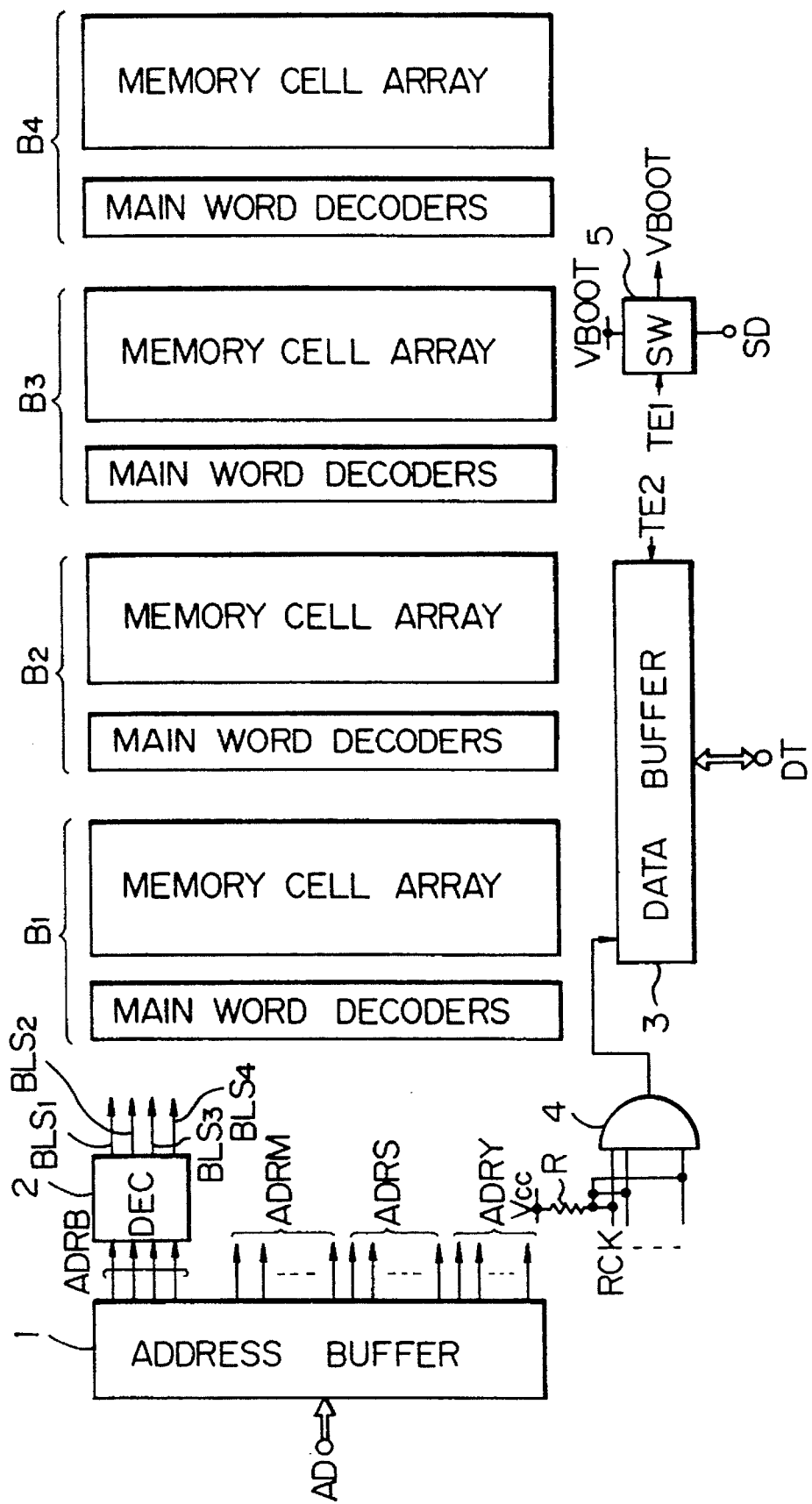

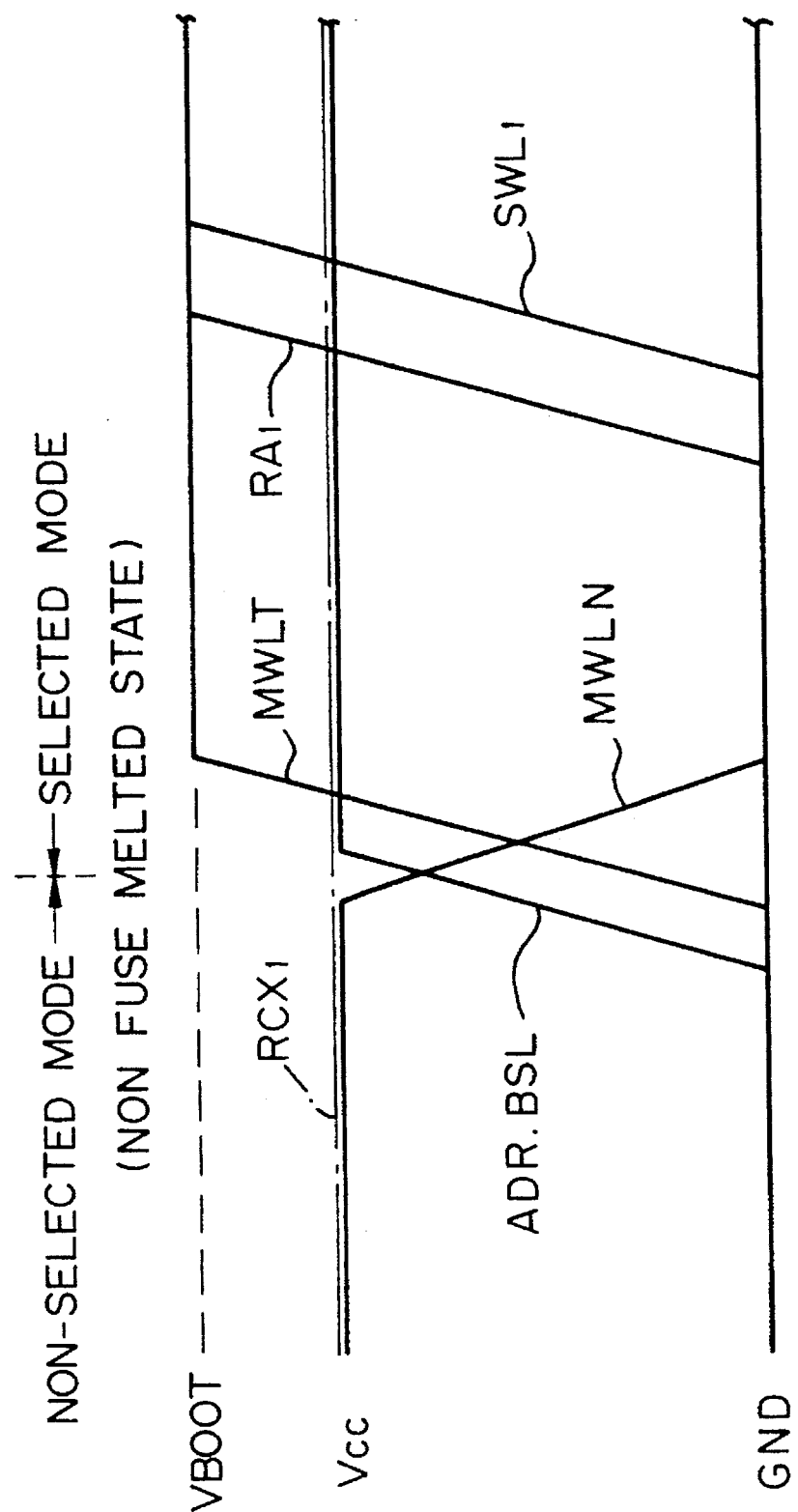

NON-SELECTED MODE → SELECTED MODE
(FUSE MELTED STATE)

NON-SELECTED MODE ←→ SELECTED MODE (FUSE MELTED STATE)

SEMICONDUCTOR MEMORY DEVICE HAVING DUAL WORD LINE CONFIGURATION

BACKGROUND OF THE INVENTION

1. Field of the Invention

The present invention relates to a semiconductor memory device such as a dynamic random access memory (DRAM) device including a dual word line configuration having main word lines and sub word lines.

2. Description of the Related Art

In a prior art DRAM device incorporating redundancy memory cells, if a defective memory cell is found, an address indicating the defective memory cell is written into a redundancy decoder by laser trimming or the like and, and simultaneously, a fuse within a sense amplifier connected to the defective memory cell is melted. Thus, no direct current (DC) path is generated in the sense amplifier connected to the defective memory cell in a sense mode, to thereby reduce the power dissipation (see JP-A-HEI3-225851). This will be explained later in detail.

On the other hand, a dual word line configuration having main word lines and sub word lines has been adopted for DRAM devices (see Tadahiko Sugibayashi et al., "A 30 ns 256 Mb DRAM with Multi-Divided Array Structure", Digest of IEEE International Solid-State Circuits Conference, pp. 50–51, 1993). Since the main word lines and the sub word lines are separately driven, the power dissipation can be reduced. Also, the pitch of the main word lines can be not strict, which is helpful in the manufacutre of large scale devices. This will also be explained later in detail.

In the above-described dual word line type DRAM device, a voltage at one of the main word lines is always different from a voltage at the other. Therefore, if the two main word lines are short-circuited, a current always flows therethrough, which increases the power dissipation.

If fuses are forcibly introduced into the main word lines of the dual word line configuration, the melting of the fuses causes the main word lines to be in a high impedance state, so that the operation of sub word decoders connected to the main word lines is unstable.

SUMMARY OF THE INVENTION

It is an object of the present invention to reduce the power dissipation in the dual word line configuration of a semiconductor memory device.

According to the present invention, in a semiconductor memory device including a plurality of sub word lines, a plurality of sub word decoders each connected to one of the sub word lines, a plurality of pairs of main word lines each pair connected to a number of the sub word decoders, and a plurality of main word decoders each connected to one of the pairs of main word lines, each of the main word decoders causes voltages at a respective pair of the pairs of main word lines different from each other in a selection mode and causes the voltages at a respective pair of the pairs of main word lines the same as each other in a non-selction mode. Thus, in a non-selection mode, even when the pair of main word lines are short-curcuited, no current flows therethrough.

BRIEF DESCRIPTION OF THE DRAWINGS

The present invention will be more clearly understood from the description as set forth below, as compared with the prior art, with reference to the accompanying drawings, wherein:

FIGS. 6A and 6B are timing diagrams showing the operation of the circuit of FIG. 5;

FIG. 7 is a block circuit diagram illustrating an embodiment of the DRAM device according to the present invention;

FIGS. 9A and 9B are timing diagrams showing the operation of the circuit of FIG. 8 with its fuse in a non-melted state;

DESCRIPTION OF THE PREFERRED EMBODIMENTS

Before the description of the preferred embodiments, prior art DRAM devices will be explained with reference to FIGS. 1, 2, 3, 4, 5, 6A and 6B.

Figure 1:
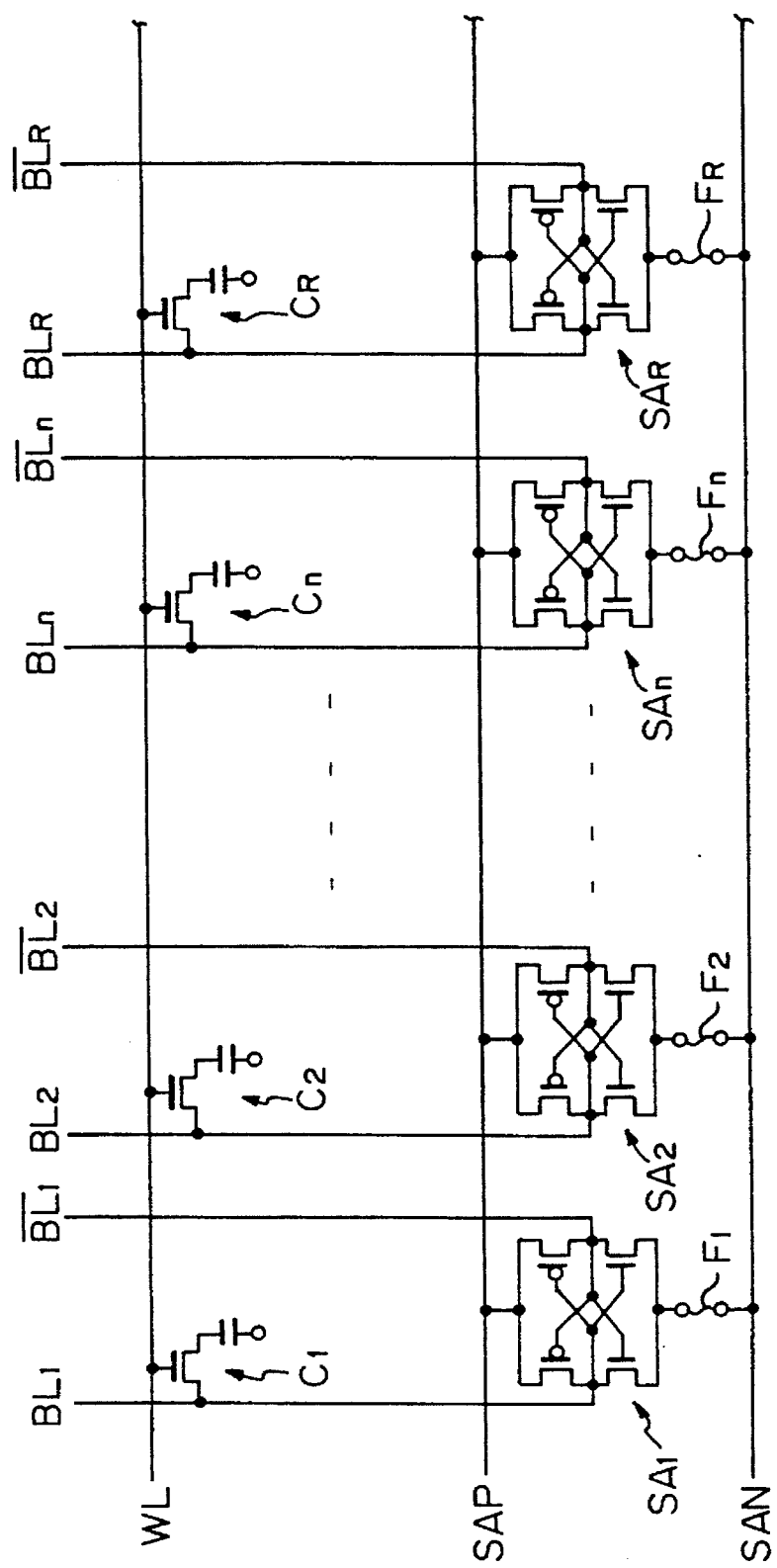
FIG. 1 is a circuit diagram illustrating a prior art DRAM device.

In FIG. 1, which illustrates a prior art DRAM device (see JP-A-HEI3-225851), memory cells $C_1$, $C_2$, . . . , $C_n$ are interposed between word lines such as WL and bit lines $BL_1$, $\overline{BL}_1$, $BL_2$, $\overline{BL}_2$, . . . , $BL_n$, and $\overline{BL}_n$, and redundancy memory cells such as $C_R$ are interposed between the word lines and redundancy bit lines $BL_R$ and $\overline{BL}_R$. The bit lines $BL_1$, $\overline{BL}_1$, $BL_2$, $\overline{BL}_2$, . . . , $BL_n$, and $\overline{BL}_n$ are connected to sense amplifiers $SA_1$, $SA_2$, . . . , $SA_n$, respectively, and the redundancy bit lines $BL_R$ and $\overline{BL}_R$ are connected to a redundancy sense amplifier $SA_R$. The sense amplifiers $SA_1$, $SA_2$, . . . , $SA_n$ and $SA_R$ are connected between a sense amplifier drive line SAP and a sense amplifier drive line SAN, and fuses $F_1$, $F_2$, . . . , $F_n$ and $F_R$ are interposed thereinto. Note that, in a non sense mode, the voltages at the sense amplifier drive lines SAP and SAN are made an intermediate voltage $V_{cc}/2$ between a high voltage $V_{cc}$ and a low voltage GND. On the other hand, in a sense mode, the voltage at the sense amplifier drive line SAP is made the high voltage $V_{cc}$ and the voltage at the sense amplifier drive line SAN is made GND.

If a defective memory cell, short-circuited bit lines or a short-circuited sense amplifier is found, an address (hereinafter, referred to as a defective address) indicating such a defective memory cell, short-circuited bit lines or a short-circuited sense amplifier is written into a redundancy decoder (not shown). Simultaneously, a fuse such as $F_1$ corresponding to the defective address is melted. As a result, when the defective address is accessed, the redundancy bit lines $BL_R$ and $\overline{BL_R}$ are selected instead of the bit lines $BL_1$ and $\overline{BL_1}$. In this case, even if a DC path is formed between the bit lines $BL_1$ and $\overline{BL_1}$ or within the sense amplifier $SA_1$, no DC current flows therethrough due to the melted fuse $F_1$. Thus, the power dissipation is reduced.

Figure 2:
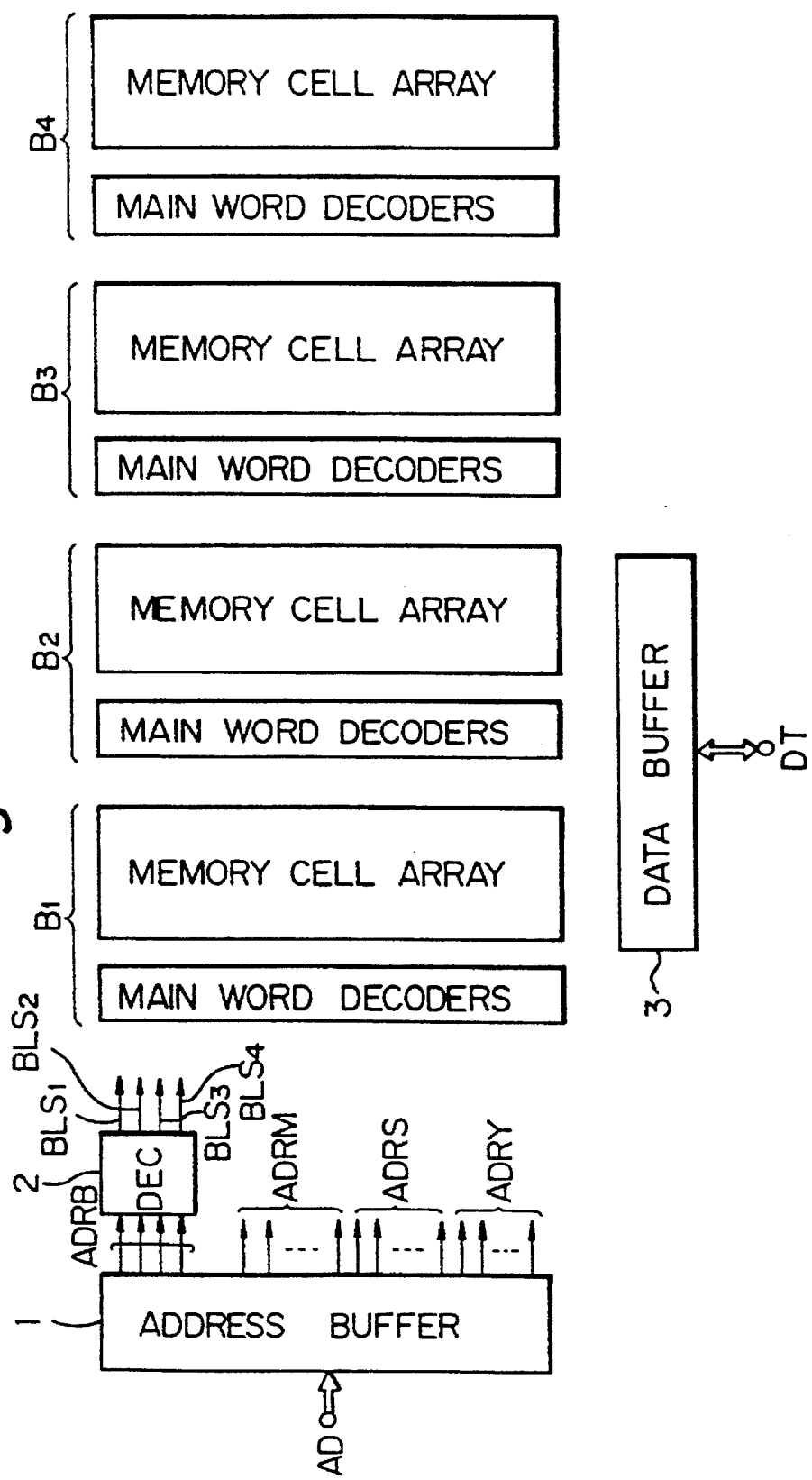
FIG. 2 is a block circuit diagram illustrating another prior art DRAM device.

In FIG. 2, which illustrates another prior art DRAM device, a dual word line configuration is adopted. (see Tadahiko Sukibayashi et al., "A 30 ns 256 Mb DRAM with Multi-Divided Array Structure", Digest of IEEE International Solid-State Circuit Conference, pp. 50–51, 1993). In the FIG. 2 device, four blocks $B_1$, $B_2$, $B_3$ and $B_4$ are provided. Also, an address buffer 1 is provided for receiving an address signal AD to generate a block selection address signal ADRB, a main word line selection address signal ADRM, a sub word line selection address signal ADRS, and a column selection address signal ADRY. The block selection address signal ADRB, which is in this example 2 bits, is supplied to a block decoder 2 which generates block selection signals $BLS_1$, $BLS_2$, $BLS_3$ and $BLS_4$. Also, the main word line selection signal ADRM is supplied to the main word line decoders of each block, and the sub word line selection signal ADRS is supplied to the predecoders of each block. Further, the column selection address signal ADRY is supplied to the blocks $B_1$, $B_2$, $B_3$ and $B_4$.

Also, in FIG. 2, reference numeral 3 designates a data buffer between the blocks $B_1$, $B_2$, $B_3$ and $B_4$ and data terminals DT.

Figure 3:
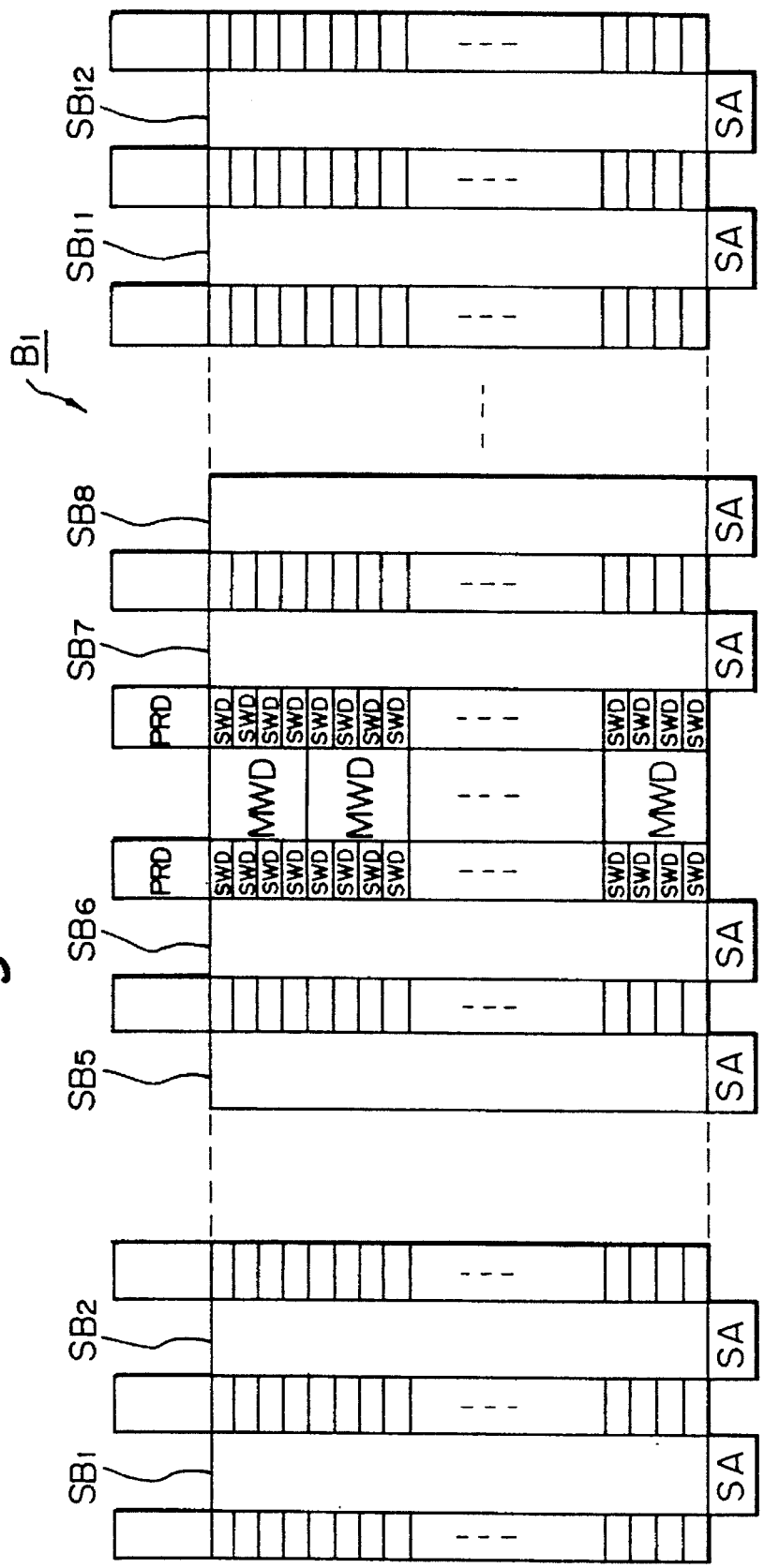
FIG. 3 is a detailed block circuit diagram illustrating a block of the divece of FIG. 2.

In FIG. 3, which is a detailed block circuit diagram of one of the blocks such as $B_1$, the memory cell array of the block $B_1$ is divided into twelve sub blocks $SB_1$, $SB_2$, ..., and $SB_{12}$ each surrounded by sub word decoders SWD. Also, provided at a center of the blocks $SB_1$, $SB_2$, ..., and $SB_{12}$ are a series of main word decoders MWD. Further, provided for each series of the sub word decoders SWD is a word drive predecoder PRD. Also, reference numeral SA designates sense amplifiers.

Figure 4:
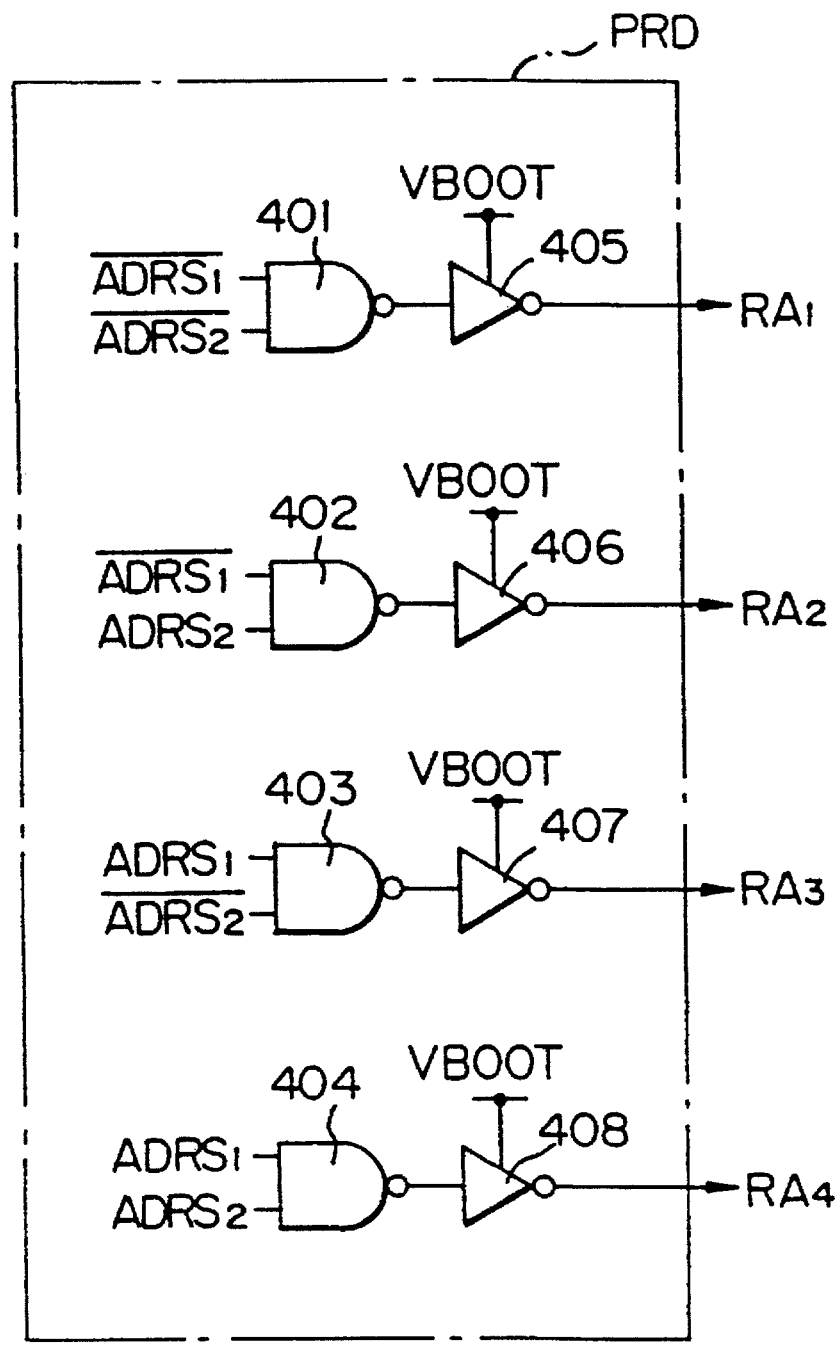
FIG. 4 is a circuit diagram illustrating the word drive predecoder of FIG. 3.

In FIG. 4, which is a detailed circuit diagram of the word drive predecoder PRD of FIG. 3, the word drive decoder PRD includes four NAND circuits 401 to 404, each for receiving two bits of the sub word selection signal ADRS and four inverters 405 through 408 powered by a high voltage VBOOT which is higher than a voltage $V_{cc}$. As a result, the word drive predecoder PRD causes one of the sub control signals $RA_1$ to $RA_4$ to be VBOOT in accordance with the two bits $ADRS_1$ and $ADRS_2$.

Figure 5:
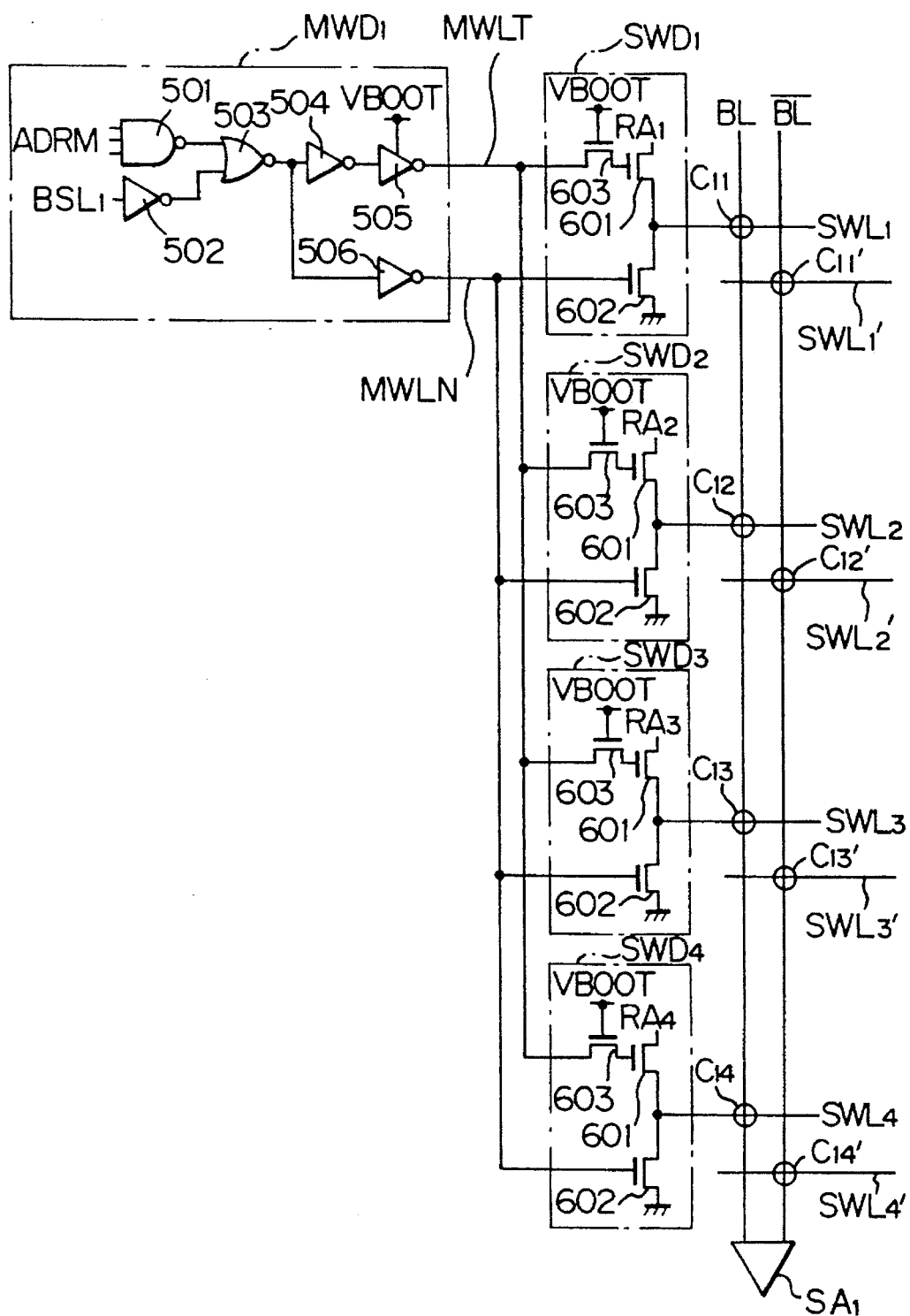
FIG. 5 is a detailed circuit diagram of the main word decoder and the sub word decoders of FIG. 4.

In FIG. 5, which is a detailed circuit diagram of one main word decoder $MWD_1$ and four sub word decoders $SWD_1$ to $SWD_4$, the main word decoder $MWD_1$ is connected by main word lines MWLT and MWLN to the sub word decoders $SWD_1$ to $SWD_4$, which are connected to sub word lines $SWL_1$ to $SWL_4$, respectively. Note that other sub word lines $SWL_1'$ to $SWL_4'$ are connected to other sub word decoders (not shown). Also, memory cells $C_{11}$, $C_{12}$, $C_{13}$ and $C_{14}$ are provided at intersections between a bit line BL and the sub word lines $SWL_1$ to $SWL_4$, and memory cells $C_{11}'$, $C_{12}'$, $C_{13}'$ AND $C_{14}'$ are provided at intersections between a bit line $\overline{BL}$ and the sub word lines $SWL_1'$ to $SWL_4'$. The bit line BL and $\overline{BL}$ are connected to a sense amplifier $SA_1$, to thereby form a folded bit line configuration.

The main word decoder $MWD_1$ is formed by a NAND circuit 501 for receiving the main word line selection address signal ADRM, an inverter 502 for receiving the block selection signal $BSL_1$, a NOR circuit 503, and inverters 504 to 506. In this case, the inverters 502, 504 and 506 are powered by the voltage $V_{cc}$, while the inverter 505 is powered by the voltage VBOOT. As a result, when the main word selection address signal ADRM and the block selection signal $BSL_1$ are both active, the output of the NOR circuit 503 is high ($V_{cc}$) and, as a result, the voltage at the main word line MWLT is VBOOT and the voltage at the main word line MWLN is GND. Conversely, when at least one of the main word selection address signal ADRM and the block selection signal $BSL_1$ is inactive, the output of the NOR circuit 503 is low (=GND) and, as a result, the voltage at the main word line MWLT is GND and the voltage at the main word line MWLN is $V_{cc}$.

Each of the sub word decoders $SWD_1$ to $SWD_4$ is formed by two N-channel MOS transistors 601 and 602 powered by the sub control signal such as $RA_1$. The connection node between the transistors 601 and 602 is connected to the sub word line such as $SWL_1$. Also, each of the sub word decoders $SWD_1$ to $SWD_4$ includes an N-channel MOS transistor 603 connected between the main word line MWLT and the gate of the transistor 601. The transistor 603 prevents the transistor on the high power voltage side of the inverter 505 from being turned ON when the voltage at sub word line $SWL_1$ or the like is higher than VBOOT. As a result, when the voltages at the main word lines MWLT and MWLN are VBOOT and GND, and also, the voltage of the sub control signal $RA_1$ is VBOOT, the voltage at the sub word line $SWL_1$ is VBOOT, i.e., the sub word line $SWL_1$ is selected. Conversely, when the voltage at main word lines MWLT and MWLN are GND and $V_{cc}$, and also, the voltage of the sub control signal $RA_1$ is VBOOT, the voltage at the sub word line $SWL_1$ is GND, i.e., the sub word line $SWL_1$ is not selected.

Figure 6A:
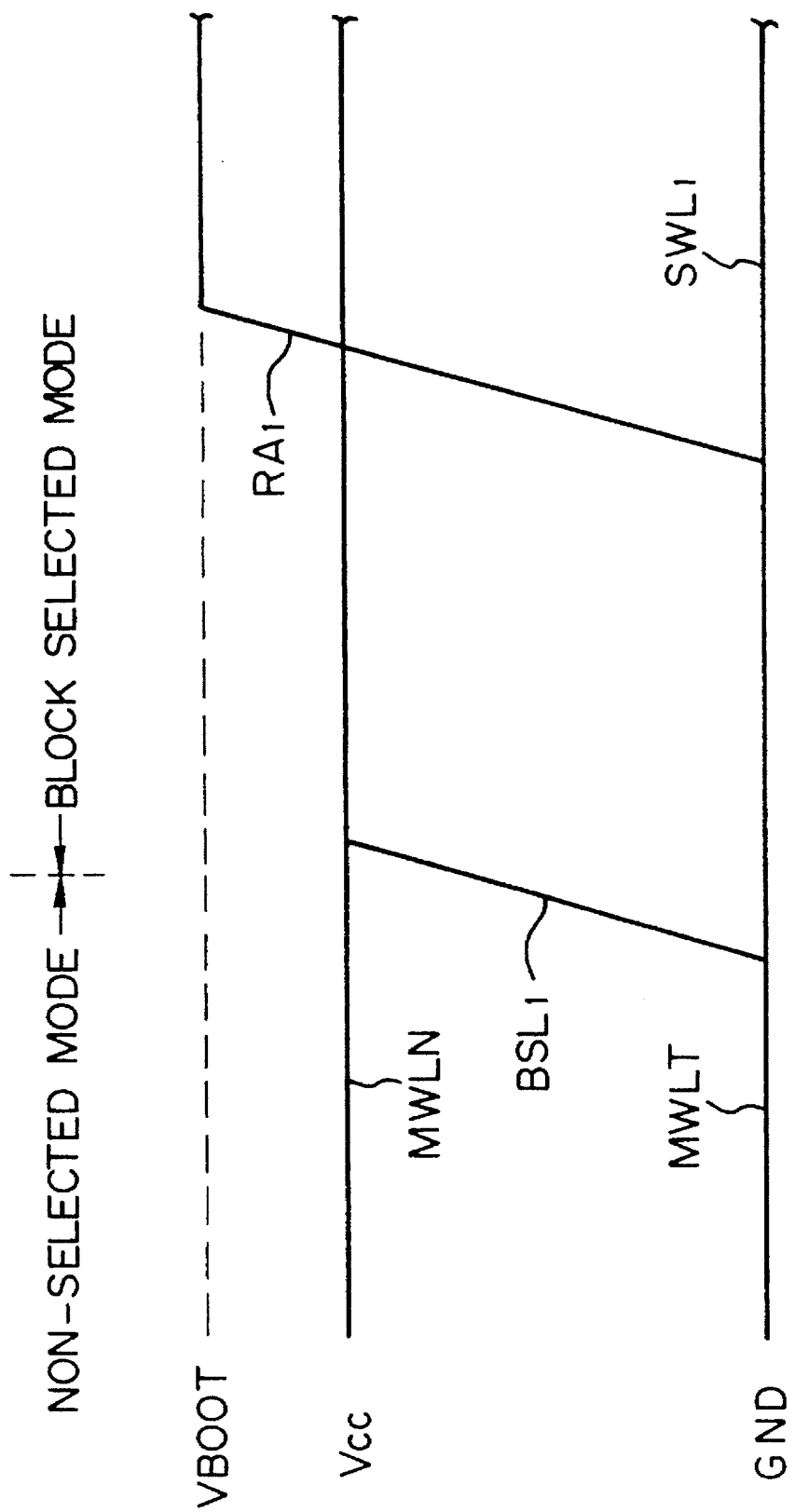

That is, as shown in FIGS. 6A and 6B, in a non-selected mode where the main word line selection signal ADRM and the block selection signal $BSL_1$ are both inactive, the voltage at the main word line MWLT is GND and the voltage at the main word line MWLM is $V_{cc}$. Also, as shown in FIG. 6A, in a block-selected mode where the main word line selection signal ADRM is inactive and the block selection signal $BSL_1$ is active, the voltage at the main word line MWLT is GND and the voltage at the main word line MWLM is $V_{cc}$. Further, as shown in FIG. 6B, in a selected mode where the main word line selection signal ADRM and the block selection signal $BSL_1$ are both active, the voltage at the main word line MWLT is VBOOT and the voltage at the main word line MWLM is GND.

In any of the modes, the voltage at the main word line MWLT is always different from that at the main word line MWLN. Therefore, if the main word lines MWLT and MWLN are short-circuited, a current always flows therethrough. Also, if the sub word lines $SWL_1$ to $SWL_4$ and the bit lines BL and $\overline{BL}$ are short-circuited, a current also flows therethrough.

When the fuse system of the DRAM device of FIG. 1 is applied to the main word lines MWLT and MWLN of FIG. 5, the melted fuse puts the main word lines MWLT and MWLN in a high impedance state, to make the sub word decoders $SWD_1$ to $SWD_4$ unstable. Therefore, it is impossible to apply the fuse system of FIG. 1 to the main word lines MWDT and MWDN of FIG. 5.

In FIG. 7, which illustrates an embodiment of the present invention, the main word decoders of the blocks $B_1$, $B_2$, $B_3$ and Be are modified, which will be explained later in detail. Also, an AND circuit 4 for receiving roll call signals $RCX_1$, ... from the main word decoders is added and is connected to the data buffer 3. Further, a switch circuit 5 is provided for switching the high voltage VBOOT in accordance with a voltage at a test terminal TE1. Still further, the state of the data buffer 3 is switched by a voltage at a test terminal TE2.

Figure 8:
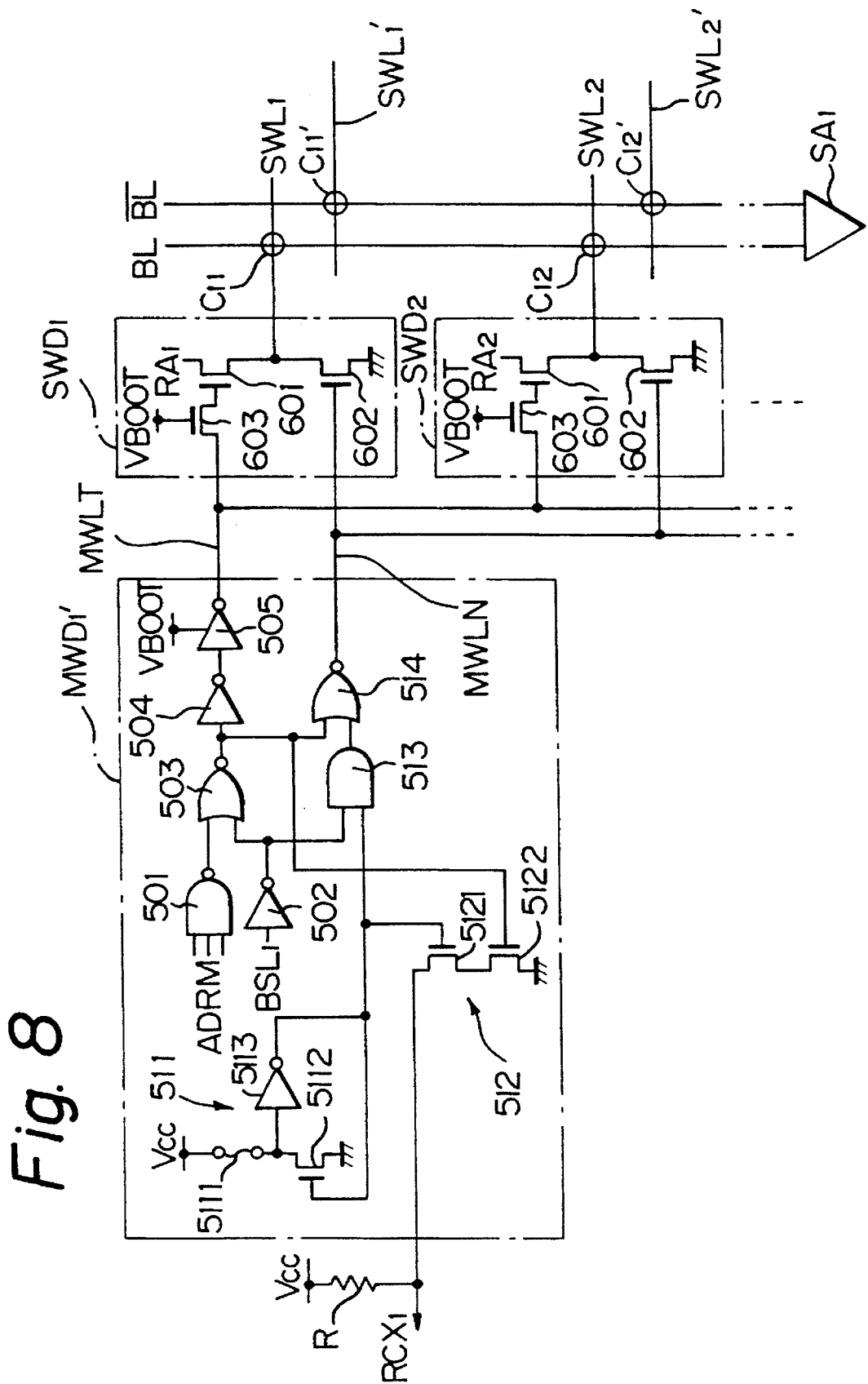
FIG. 8 is a detailed circuit diagram of the main word decoder and the sub word decoders of FIG. 7.

In FIG. 8, which is a detailed circuit of the main word decoder MWD$_1$' of FIG. 7, a fuse circuit 511, a fuse state monitoring circuit 512, and an AND circuit 513 are added to the elements of the main word decoder MWD$_1$ of FIG. 5. Also, a NOR circuit 514 is provided instead of the inverter 506 of FIG. 5.

The fuse circuit 511 is formed by a fuse 5111 and an N-channel MOS transistor 5112 connected in series between the voltages V$_{cc}$ and GND. The fuse circuit 511 also includes an inverter 5113 connected between the drain and gate of the transistor 5112 to thereby clamp the transistor 5112.

Also, the fuse state monitoring circuit 512 is formed by N-channel MOS transistors 5121 and 5122 connected in series. The transistor 5121 is controlled by the output voltage of the fuse circuit 511, and the transistor 5122 is controlled by the output voltage of the NOR circuit 503.

The operation of the circuit of FIG. 8 is explained next with reference to FIGS. 9A, 9B, 10A, and 10B.

Figure 9A:
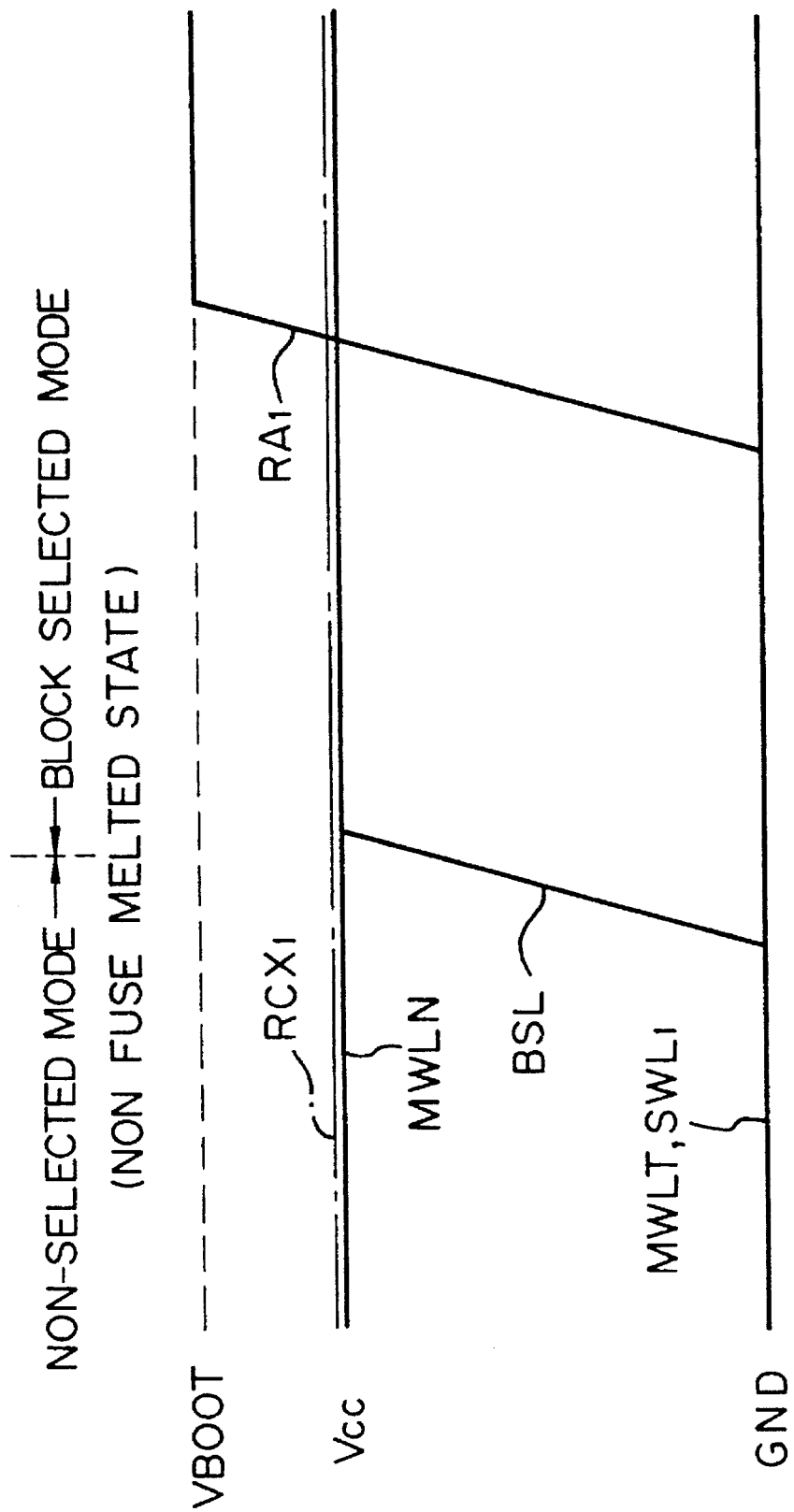

When the fuse 5111 is not melted, the output voltage of the fuse circuit 511 is low (=GND), so that the AND circuit 513 is disabled. Thus, the NOR circuit 514 serves as the inverter 602 of FIG. 5. Therefore, as shown in FIGS. 9A and 9B, the circuit of FIG. 8 operates in the same way as the circuit of FIG. 5 as shown in FIGS. 6A and 6B. In this case, since the transistor 5121 is turned OFF, the roll call signal RCX$_1$ is held at V$_{cc}$ by a pull-up resistor R.

When the main word lines MWLT and MWLN are short-circuited, the fuse 5111 is melted by laser trimming or the like. Detection of a short-circuited state will be explained later.

Figure 10A:
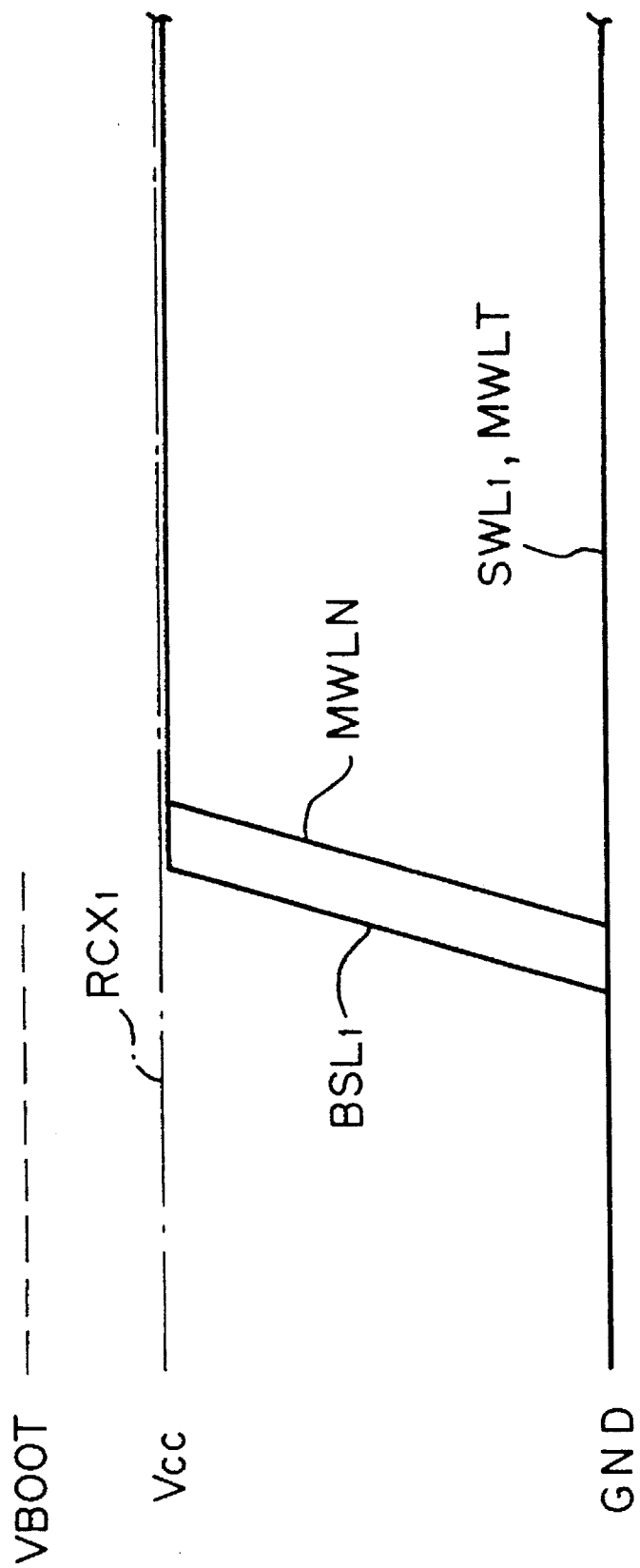
FIGS. 10A and 10B are timing diagrams showing the operation of the circuit of FIG. 8 with its fuse in a non-melted state.

A non-selected mode in a fuse melted state is now explained with reference to FIGS. 10A and 10B. In this case, the main word selection address signal ADRM and the block selection signal BSL$_1$ are both inactive, and as a result, the output voltage of the NOR circuit 503 is low (=GND) and the output voltage of the inverter 505 is low (=GND). On the other hand, the output voltage of the fuse circuit 511 is high (=V$_{cc}$) and the output voltage of the inverter 502 is high (V$_{cc}$) and, as a result, the output voltage of the AND circuit 513 is high (=V$_{cc}$). Therefore, even when the output voltage of the NOR circuit 503 is low (=GND), the output voltage of the NOR circuit 514 is low (=GND). Thus, the main word lines MWLT and MWLN are both low (=GND), so that no short-circuited current flows therethrough. Also, the transistors 601 and 602 of the sub word decoders SWD$_1$ to SWD$_4$ are both in an OFF state, so that a short-circuited current between the sub word lines SWL$_1$ to SWL$_4$ and the bit lines BL and $\overline{BL}$ never flows therethrough.

Also, in the fuse state monitoring circuit 512, the transistor 5122 is turned OFF by the low output voltage of the NOR circuit 503. As a result, the roll call signal RCX$_1$ remains at V$_{cc}$.

A block selected mode in a fuse melted state is now explained with reference to FIG. 10A. In this case, the main word selection address signal ADRM is inactive and the block selection signal BSL$_1$ is active and, as a result, the output voltage of the NOR circuit 503 is low (=GND) and the output voltage of the inverter 505 is low (=GND). On the other hand, the output voltage of the fuse circuit 511 is high (=V$_{cc}$) and the output voltage of the inverter 502 is low (=GND), and as a result, the output voltage of the AND circuit 513 is low (=GND). Therefore, since the output voltage of the NOR circuit 503 is low (=GND), the output voltage of the NOR circuit 514 is high (=V$_{cc}$). Thus, the voltage at the sub word lines SWL$_1$ to SWL$_4$ is reduced to GND. Note that, if the sub word lines SWL$_1$ to SWL$_4$ are in a high impedance state, parasitic capacitances between the bit lines BL and $\overline{BL}$ and the sub word lines SWL$_1$ to SWL$_4$ create noise. Such noise can be avoided by grounding the sub word lines SWL$_1$ to SWL$_4$.

Also, in the fuse state monitoring circuit 512, the transistor 5122 is turned OFF by the low output voltage of the NOR circuit 503. As a result, the roll call signal RCX$_1$ remains at V$_{cc}$.

A selected mode in a fuse melted state is now explained with reference to FIG. 10B. In this case, the main word selection address signal ADRM and the block selection signal BSL$_1$ are both active, and as a result, the output voltage of the NOR circuit 503 is high (=V$_{cc}$) and the output voltage of the inverter 505 is high (=VBOOT). On the other hand, the output voltage of the fuse circuit 511 is low (=GND) and the output voltage of the inverter 502 is low (=GND) and, as a result, the output voltage of the AND circuit 513 is low (=GND). Therefore, since the output voltage of the NOR circuit 503 is high (=V$_{cc}$), the output voltage of the NOR circuit 514 is low (=GND). Thus, the main word lines MWLT and MWLN are high (=VBOOT) and low (=GND), respectively. Thereafter, when the voltage of the sub word control signal RA$_1$ is changed from GND to VBOOT, the voltage of the sub word line SWL$_1$ is changed from GND to VBOOT.

Also, in the fuse state monitoring circuit 512, the transistors 5121 and 5122 are turned OFF by the low output voltage of the fuse circuit 511 and the low output voltage of the NOR circuit 503. As a result, the roll call signal RCX$_1$ is changed from V$_{cc}$ to GND. Also, when the roll call signal RCX$_1$ is changed from V$_{cc}$ to GND, the output voltage of the AND circuit 4 of FIG. 7 is also changed from V$_{cc}$ to GND. The output voltage of the AND circuit 4 can pass through one bit of the data buffer 3 when the voltage at the test terminal TE2 is made high.

Figure 11:
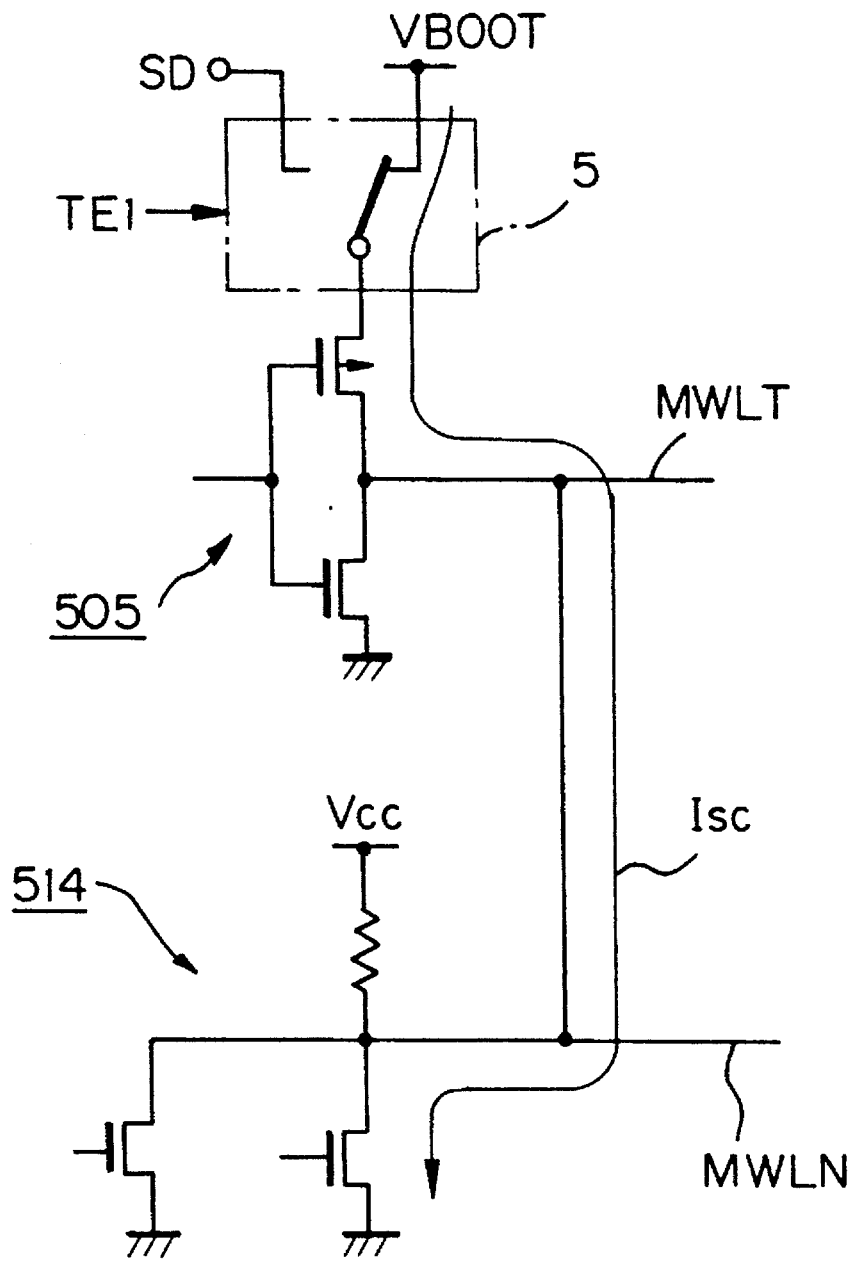
FIG. 11 is a circuit diagram explaining a short-circuit current flowing in the circuit of FIG. 8.
Figure 12:
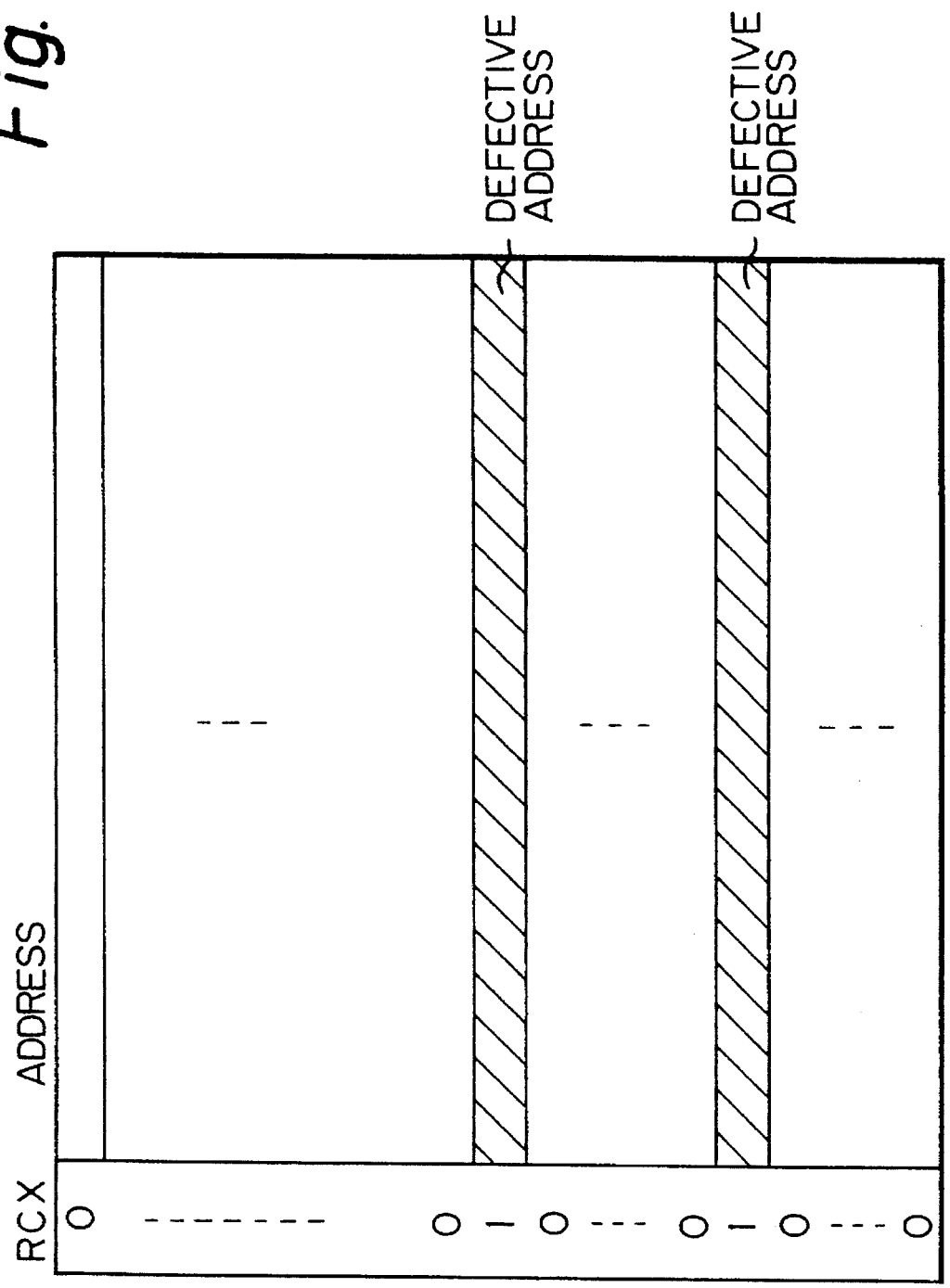
FIG. 12 is a diagram showing the content of a memory.

In order to find out a short-circuited state of the main word lines MWLT and MWLN, a roll call test is carried out by scanning the address signal ADR (see FIG. 2). Note that, if the main word lines MWLT and MWLN are short-circuited as illustrated in FIG. 11, a short-circuited current I$_{sc}$ flows from the terminal VBOOT via a P-channel MOS transistor of the inverter 505, the main word lines MWLT and MWLN and an N-channel MOS transistor of the NOR circuit 514 to the ground terminal GND. Therefore, in order to find out such a short-circuited current I$_{sc}$, the switch circuit 5 is turned ON by the voltage at the test terminal TE1. In this case, a current meter is connected to the terminal SD. After the roll call test is completed, defective addresses corresponding to detected short-circuited main word lines are written into an external memory as illustrated in FIG. 12. For example, if a 1 Gbit memory device is constructed by 4192 main word line pairs, 32768 sub word lines, 32768 bit line pairs, an entire roll test time is $$200 \text{ ns} \times 32768/8 \approx 0.8 \text{ ms}$$

where 200 ns is one write/read cycle. Therefore, even if a roll test is carried out every time the power is ON, the roll test time can be negligible.

In the semiconductor memory device according to the present invention, redundancy memory cells are not provided. Therefore, an access to the semiconductor memory device is carried out after referring to the above-mentioned external memory as illustrated in FIG. 12.

Figure 13:
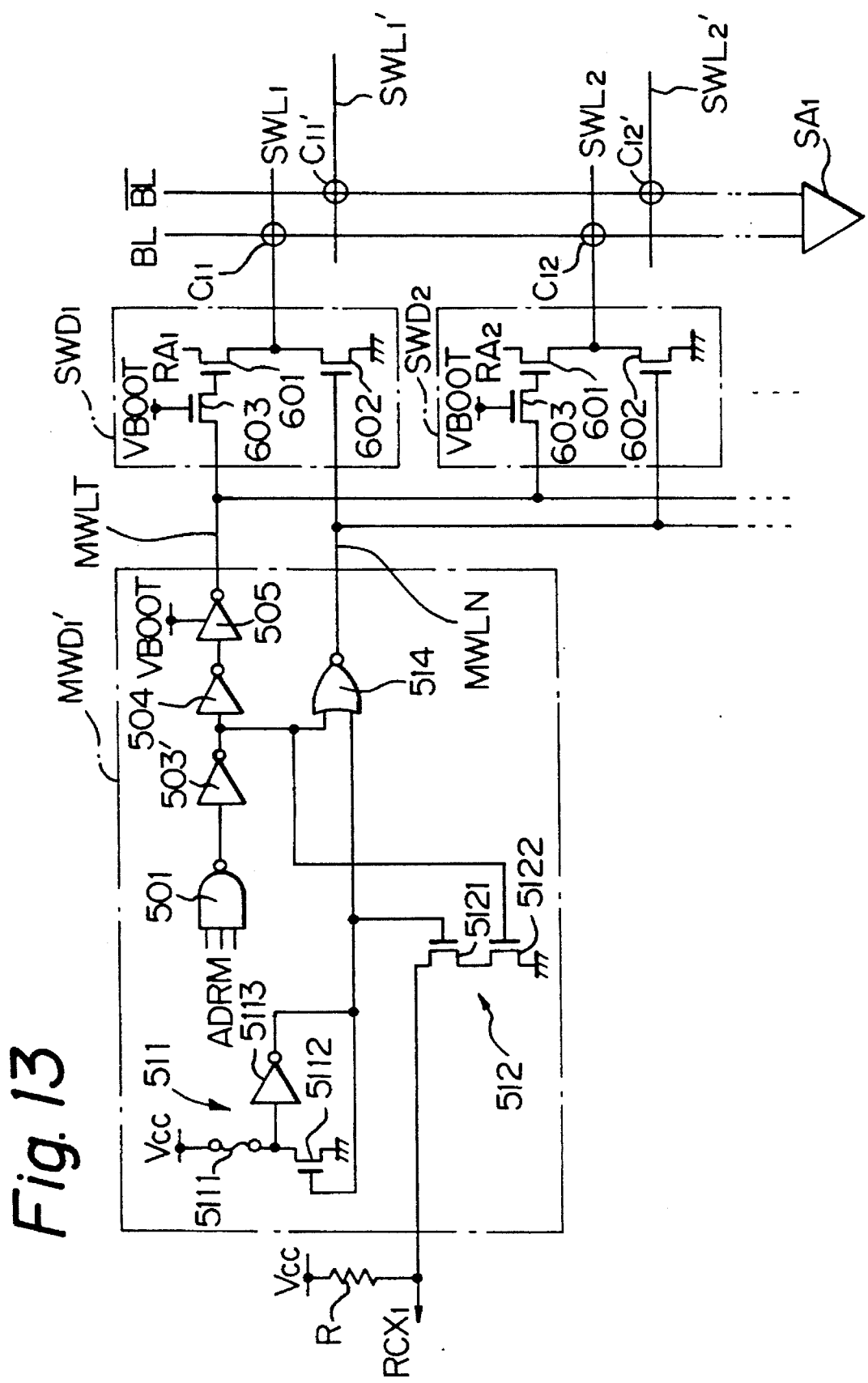
FIG. 13 is a circuit diagram illustrating a modification of the circuit of FIG. 8.

In FIG. 13, which is a modification of the circuit of FIG. 8, the block selection signal BSL$_1$ is not provided. That is, assume that only one block such as B$_1$ as illustrated in FIG. 2 is provided. In this case, the inverter 502 of FIG. 8 is not provided, and the NOR circuit 503 of FIG. 5 is modified into an inverter 503'. Also, the AND circuit 513 of FIG. 5 is not provided, and therefore the output of the fuse circuit 511 is connected directly to the NOR circuit 514.

Figure 10B:
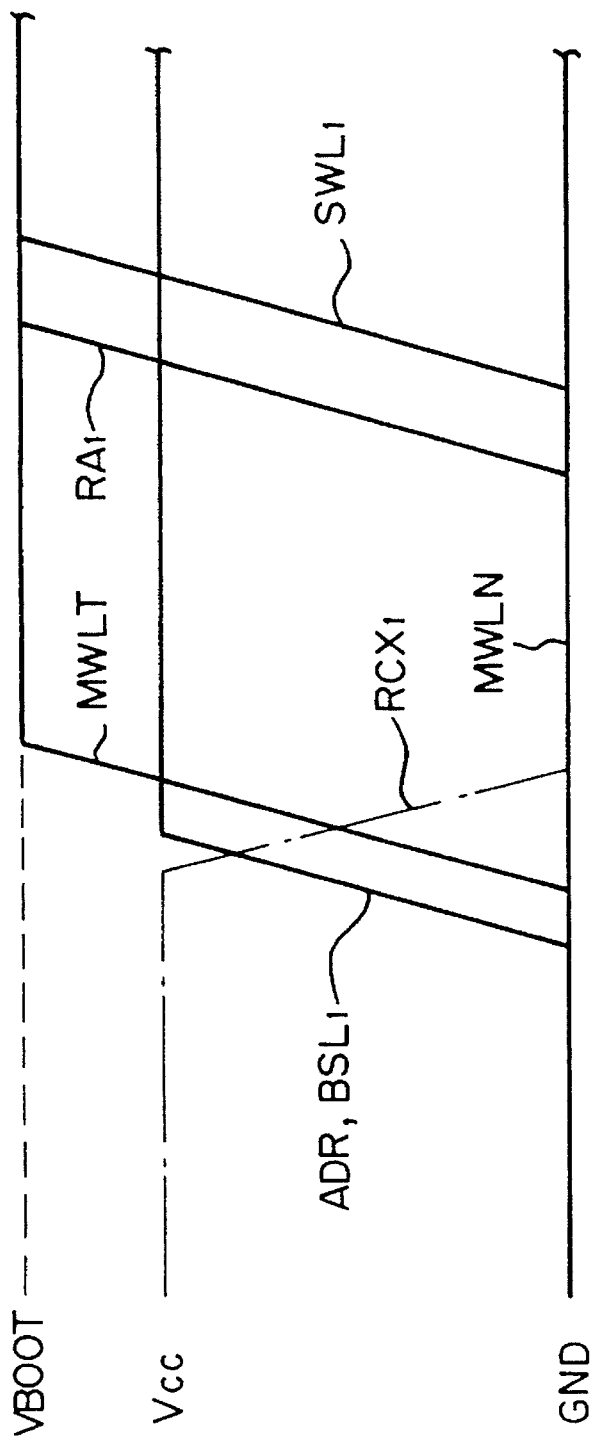
Figure 14A:
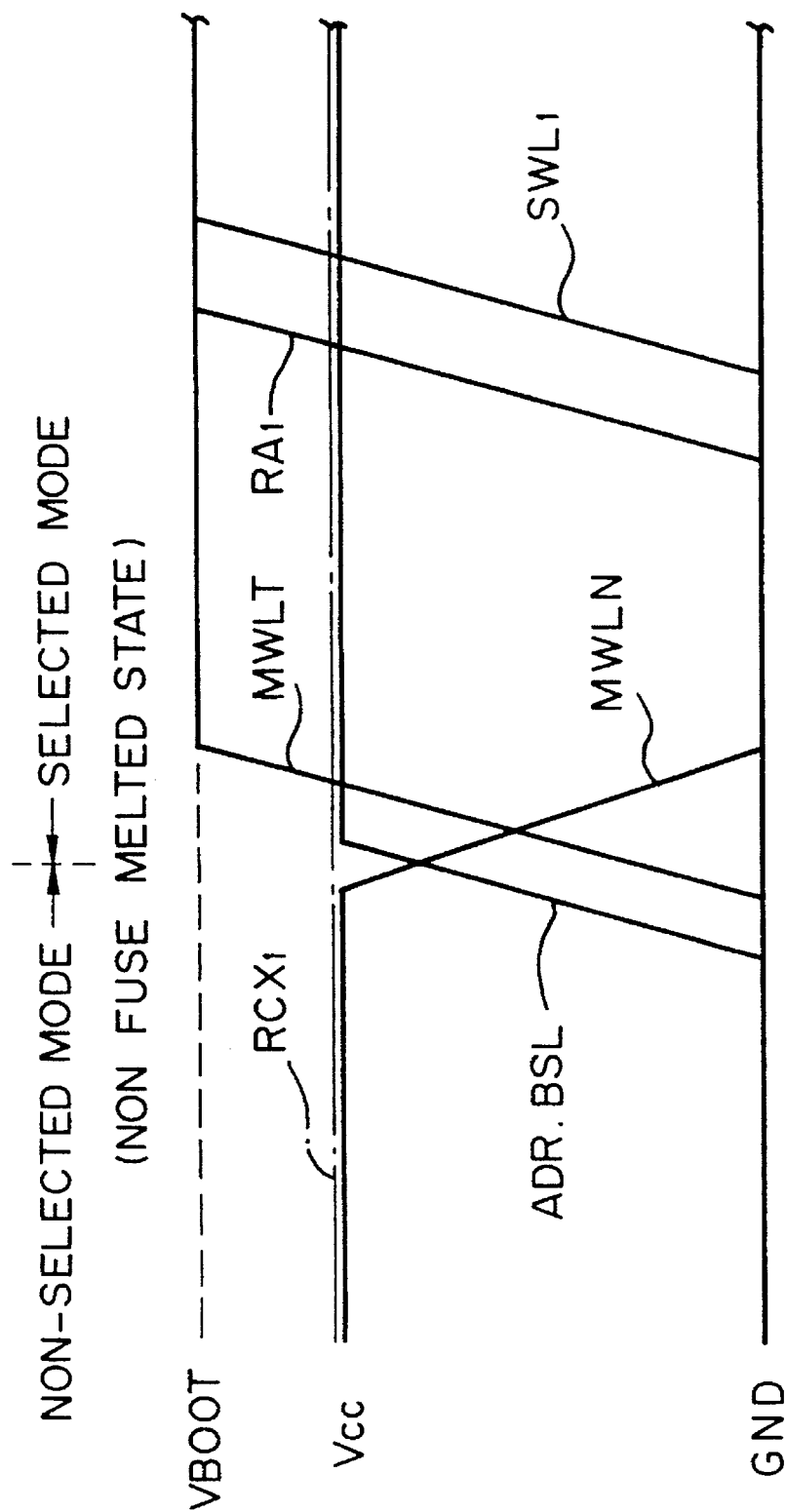
FIGS. 14A and 14B are timing diagrams showing the operation of the circuit of FIG. 13.
Figure 14B:
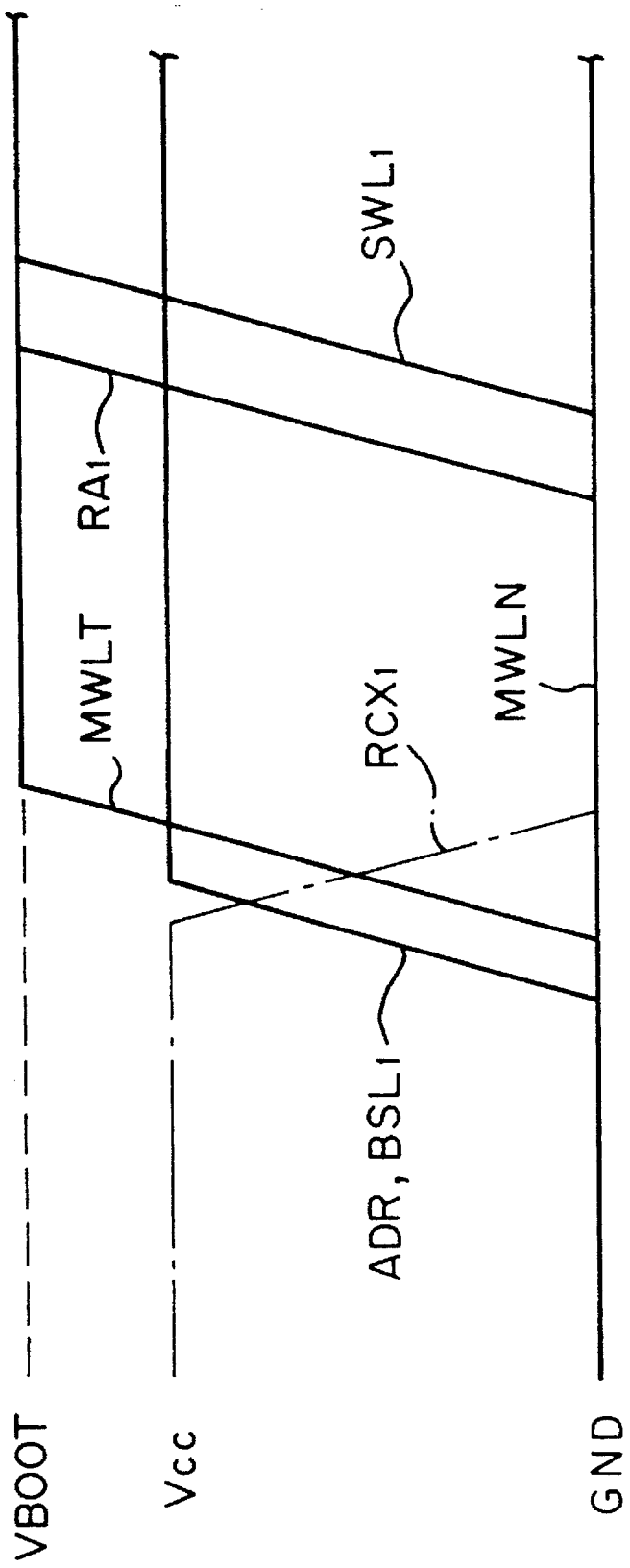

The operation of the circuit of FIG. 13 where the fuse 5111 is not melted is shown in FIG. 14A which is the same as FIG. 9B, and the operation of the circuit of FIG. 13 where the fuse 5111 is melted is shown in FIG. 14B which is the same as FIG. 10B.

In the above-described embodiment, even if the main word lines are not short-circuited, when a defective memory cell is found it is possible to melt a fuse corresponding to this defective memory cell. Also, when detecting a short-circuited state of the main word lines, circuits other than the address buffer 1 and the decoder 2 can be disabled, so that a short-circuited current is increased and can be easily detected.

As explained above, according to the present invention, since no short-circuited current flows through short-circuited main word lines in a non-selected mode, the power dissipation can be reduced.

We claim:

1. A semiconductor memory device comprising:

a plurality of sub word lines;

a plurality of sub word decoders, each connected to one of said sub word lines;

a plurality of pairs of main word lines, each pair connected to a number of said sub word decoders; and a plurality of main word decoders, each comprising a fuse circuit including a fuse, each of said main word decoders connected to one of said pairs of main word lines, and each of said main word decoders including means for setting voltages between a respective pair of lines of said pairs of main word lines different from each other in a selection mode and for setting the voltages between a respective pair of lines of said pairs of main word lines the same as each other in a non-selection mode and only when said fuse is melted.

2. A device as set forth in claim 1, wherein each of said main word decoders comprises a monitoring circuit, connected to said fuse circuit, for monitoring a state of said fuse and generating an output representing said state.

3. A device as set forth in claim 2, wherein said monitoring circuit has means for being activated only when a respective one of said main word decoders is in a selection mode.

4. A device as set forth in claim 2, further comprising a logic circuit, connected to said monitoring circuit output of each of said main word decoders, for generating a logic signal representing the state of said fuse of one of said main word decoders.

5. A semiconductor memory device comprising:

a first power supply terminal to which a first power supply voltage is applied;

a second power supply terminal to which a second power voltage lower than said first power supply voltage is applied;

a third power supply terminal to which a third power voltage lower than said second power supply voltage is applied;

a plurality of predecoding lines;

a predecoding means, connected to said predecoding lines, for selecting one predecoding line and applying said first power supply voltage thereto;

a plurality of sub word lines;

a plurality of sub word decoders, each including a first N-channel MOS transistor having a drain connected to one of said predecoding lines, a source connected to one of said sub word lines, and a gate, and a second N-channel MOS transistor having a drain connected to the source of said first N-channel MOS transistor, a source connected to said third power supply terminal;

a plurality of pairs of first and second main word lines, said first and second main word lines being connected to the gates of said first and second N-channel MOS transistors, respectively, of a number of said sub word decoders; and a plurality of main word decoders each connected to one of said pairs of main word lines, each of said main word decoders comprising:

a first logic circuit for receiving an address signal to generate a selection signal;

a second logic circuit, connected between said first logic circuit and said first main word line, for applying said first power supply voltage to said first main word line when said selection signal is active and applying said third power supply voltage to said first main word line when said selection signal is inactive;

a third logic circuit, connected between said first logic circuit and said second main word line, for applying said third power supply voltage to said first main word line when said selection signal is active and applying said second power supply voltage to said first main word line when said selection signal is inactive; and a fuse circuit, connected to said third logic circuit, for disabling said third logic circuit to apply said third power supply voltage to said second main word line when said fuse of said fuse circuit is melted.

6. A device as set forth in claim 5, wherein each of said main word decoders further comprises a monitoring circuit including:

a third N-channel MOS transistor having a drain for generating a fuse melting indicating signal, a gate connected to said fuse circuit, and a source; and a fourth N-channel MOS transistor having a drain connected to the source of said third N-channel MOS transistor, a gate connected to said third logic circuit, and a source connected to said third power supply terminal.

7. A device as set forth in claim 6, further comprising a fourth logic circuit, connected to the drain of said third N-channel MOS transistor of each of said main word decoders, for generating a logic signal representing the state of said fuse of one of said main word decoders.

8. A semiconductor memory device comprising:

a first power supply terminal to which a first power supply voltage is applied;

a second power supply terminal to which a second power supply voltage lower than said first power supply voltage is applied;

a third power supply terminal to which a third power supply voltage lower than said second power supply voltage is applied;

a plurality of predecoding lines;

a predecoding means, connected to said predecoding lines, for selecting one of said predecoding lines and applying said first power supply voltage thereto;

a plurality of sub word lines;

a plurality of sub word decoders, each including a first N-channel MOS transistor having a drain connected to one of said predecoding lines, and a source connected to one of said sub word lines, and a gate, and a second N-channel MOS transistor having a drain connected to the source of said first N-channel MOS transistor, a source connected to said third power supply terminal;

a plurality of pairs of first and second main word lines, said first and second main word lines being connected to the gates of said first and second N-channel MOS transistors, respectively, of a plurality of said sub word decoders; and a plurality of main word decoders each connected to one of said pairs of main word lines, each of said main word decoders comprising:

a first logic circuit for receiving an address signal to generate a first selection signal;

a second logic circuit for receiving a block selection signal to generate a second selection signal;

a third logic circuit, connected to said first and second logic circuits, for generating a third selection signal when said first and second selection signals are both active;

a fourth logic circuit, connected between said third logic circuit and said first main word line, for applying said first power supply voltage to said first main word line when said third selection signal is active and applying said third power supply voltage to said first main word line when said third selection signal is inactive;

a fifth logic circuit, connected between said third logic circuit and said second main word line, for applying said third power supply voltage to said first main word line when said third selection signal is active and applying said second power supply voltage to said first main word line when said third selection signal is inactive; and a fuse circuit having a fuse;

a sixth logic circuit, connected to said fuse circuit, said second logic circuit, and said fifth logic circuit, for disabling said fifth logic circuit to apply said third power supply voltage to said second main word line when said fuse of said fuse circuit is melted and said second selection signal is active.

9. A device as set forth in claim 8, wherein each of said main word decoders further comprises a monitoring circuit including:

a third N-channel MOS transistor having a drain for generating a fuse melting indicating signal, a gate connected to said fuse circuit, and a source; and a fourth N-channel MOS transistor having a drain connected to the source of said third N-channel MOS transistor, a gate connected to said third logic circuit, and a source connected to said third power supply terminal.

10. A device as set forth in claim 9, further comprising a seventh logic circuit, connected to the drain of said third N-channel MOS transistor of each of said main word decoders, for generating a logic signal representing the state of said fuse of one of said main word decoders.

* * * * *